US012723815B2

(12) United States Patent
English, Jr.

(10) Patent No.: US 12,723,815 B2
(45) Date of Patent: Sep. 1, 2026

(54) METHOD FOR PROVIDING A ROTATING SHAFT INTO A HIGH PRESSURE, HIGH TEMPERATURE FURNACE

(71) Applicant: Florida State University Research Foundation, Inc., Tallahassee, FL (US)

(72) Inventor: Charles Lamar English, Jr., Tallahassee, FL (US)

(73) Assignee: Florida State University Research Foundation, Inc., Tallahassee, FL (US)

( * ) Notice: Subject to any disclaimer, the term of this patent is extended or adjusted under 35 U.S.C. 154(b) by 0 days.

(21) Appl. No.: 19/295,219

(22) Filed: Aug. 8, 2025

(65) Prior Publication Data

US 2025/0362087 A1 Nov. 27, 2025

Related U.S. Application Data

(62) Division of application No. 18/884,937, filed on Sep. 13, 2024.

(60) Provisional application No. 63/610,568, filed on Dec. 15, 2023.

(51) Int. Cl.

| | |
|---|---|
| ***F27D 99/00*** | (2010.01) |
| ***F16J 15/32*** | (2016.01) |
| ***F27D 7/04*** | (2006.01) |
| ***H05B 3/66*** | (2006.01) |
| ***H05K 7/20*** | (2006.01) |

(52) U.S. Cl.
CPC .......... *F27D 99/0073* (2013.01); *F16J 15/32* (2013.01); *F27D 7/04* (2013.01); *H05B 3/66* (2013.01); *H05K 7/20* (2013.01)

(58) Field of Classification Search
CPC ......... F27D 99/0073; F27D 7/04; F16J 15/32; H05B 3/66; H05K 7/20
USPC .......................................................... 373/110
See application file for complete search history.

(56) References Cited

U.S. PATENT DOCUMENTS

2022/0213900 A1 7/2022 Seike et al.

FOREIGN PATENT DOCUMENTS

| | | | | |
|---|---|---|---|---|
| CN | 104969002 A | * 10/2015 | | F23L 5/02 |
| GB | 1537563 A | * 12/1978 | | B30B 11/002 |
| JP | 2011027227 A | * 2/2011 | | F27D 99/0073 |
| WO | WO-2015081264 A1 | * 6/2015 | | G01N 29/227 |

OTHER PUBLICATIONS

Machine Translation of JP-2011027227-A (Year: 2025).*
Machine Translation of CN-104969002-A (Year: 2025).*
Machine Translation of WO-2015081264-A1 (Year: 2025).*
Machine Translation of GB-1537563-A (Year: 2025).*

* cited by examiner

*Primary Examiner* — Edward F Landrum
*Assistant Examiner* — Thomas J Ward
(74) *Attorney, Agent, or Firm* — SALIWANCHIK, LLOYD & EISENSCHENK

(57) ABSTRACT

Systems, devices, and methods for continuously cooling a rotary shaft seal of a pressure vessel (e.g., of a furnace) are provided. A continuous flow of gas into the pressure vessel can be utilized to continuously cool the rotary shaft seal as the gas enters the pressure vessel. The rotary shaft can have a turbine wheel attached to it.

8 Claims, 5 Drawing Sheets

METHOD FOR PROVIDING A ROTATING SHAFT INTO A HIGH PRESSURE, HIGH TEMPERATURE FURNACE

CROSS-REFERENCE TO RELATED APPLICATION

This application is a divisional application of U.S. patent application Ser. No. 18/884,937, filed Sep. 13, 2024, which claims the benefit of U.S. Provisional Application Ser. No. 63/610,568, filed Dec. 15, 2023, the disclosure of which is hereby incorporated by reference in its entirety, including all figures, tables, and drawings.

BACKGROUND

Production of many types of superconductor materials and magnets require specialized high-temperature, high-pressure furnaces. In many applications, the reliability of the furnace is a top priority, as gas or temperature leaks may compromise the environment required for superconductor material production. High-pressure, high-temperature furnaces frequently have leaks or failures that prevent the furnace from reaching the required conditions efficiently. If the leaks or failures are severe, the furnace is unable to reach the required temperature or pressures at all. Temperature needs to be controlled precisely in these furnaces, which is difficult with conventional furnace designs due to leaks. The furnace still needs to have access points for gas flow and electrical feedthroughs, control thermocouples, and pressure transducers. Gas also needs to be fed at a controlled rate in a manner that properly flows throughout the furnace.

BRIEF SUMMARY

Embodiments of the subject invention provide novel and advantageous systems, devices, and methods for continuously cooling a rotary shaft seal of a pressure vessel (e.g., of a furnace). A continuous flow of gas into the pressure vessel can be utilized to continuously cool the rotary shaft seal as the gas enters the pressure vessel. The rotary shaft can have a turbine wheel attached to it. The turbine wheel, when powered, can mechanically increase the natural convective gas flow inside a baffle tube of the furnace, effectively lengthening the usable, working homogenous zone of the furnace making overpressure heat treatment (OPHT) possible for longer canted cosine theta (CCT) magnets and “Race Track” coils. Embodiments of the subject invention can be integrated with a decreasing diameter baffle tube to further increase the working hot zone (e.g., diameter of the baffle tube can decrease from the top of the baffle tube (when the baffle tube is installed and furnace is ready to use or in use) to the bottom of the baffle tube (when the baffle tube is installed and furnace is ready to use or in use)).

In an embodiment, a system for continuously cooling a rotary shaft seal of a pressure vessel can comprise: a rotary shaft; a turbine wheel attached to a first end of the rotary shaft; a T fitting having the rotary shaft disposed therethrough; a gas inlet connected to the T fitting; and a high pressure gland, the rotary shaft being disposed through the high pressure gland. The pressure vessel can be a pressure vessel of a furnace. The high pressure gland can be disposed closer to a second end of the rotary shaft than is the T fitting, wherein the second end of the rotary shaft is opposite from the first end of the rotary shaft. The high pressure gland can be counter-bored (e.g., to seat a custom-made rotary shaft seal). The high pressure gland can be, for example, a Conax™ high pressure gland. The system can further comprise the rotary shaft seal attached to the rotary shaft (e.g., within the high pressure gland). The T-fitting can be connected to a gas port of the gas inlet. The system can further comprise a baffle tube integrated with the rotary shaft. The baffle tube can have a diameter that decreases from a top of the baffle tube to a bottom of the baffle tube.

In another embodiment, a furnace can comprise: a pressure vessel; and a system for continuously cooling a rotary shaft seal of a pressure vessel, as described herein. The furnace can have any of the features described herein.

In another embodiment, a method for continuously cooling a rotary shaft seal of a pressure vessel can comprise: providing a system for continuously cooling a rotary shaft seal of a pressure vessel as described herein; attaching the rotary shaft seal to the rotary shaft; connecting the system to the pressure vessel; and operating the system to continuously cool the rotary shaft seal while the pressure vessel is in use.

In another embodiment, a method for continuously cooling a rotary shaft seal of a pressure vessel of a furnace can comprise: providing a furnace comprising a system for continuously cooling a rotary shaft seal of a pressure vessel as described herein; attaching the rotary shaft seal to the rotary shaft; connecting the system to the pressure vessel; and operating the system to continuously cool the rotary shaft seal while the pressure vessel is in use.

DETAILED DESCRIPTION

Embodiments of the subject invention provide novel and advantageous systems, devices, and methods for continuously cooling a rotary shaft seal of a pressure vessel (e.g., of a furnace). A continuous flow of gas into the pressure vessel can be utilized to continuously cool the rotary shaft seal as the gas enters the pressure vessel. The rotary shaft can have a turbine wheel attached to it. The turbine wheel, when powered, can mechanically increase the natural convective gas flow inside a baffle tube of the furnace, effectively lengthening the usable, working homogenous zone of the furnace making overpressure heat treatment (OPHT) possible for longer canted cosine theta (CCT) magnets and "Race Track" coils. Embodiments of the subject invention can be integrated with a decreasing diameter baffle tube to further increase the working hot zone (e.g., diameter of the baffle tube can decrease from the top of the baffle tube (when the baffle tube is installed and furnace is ready to use or in use) to the bottom of the baffle tube (when the baffle tube is installed and furnace is ready to use or in use)).

Figure 1:
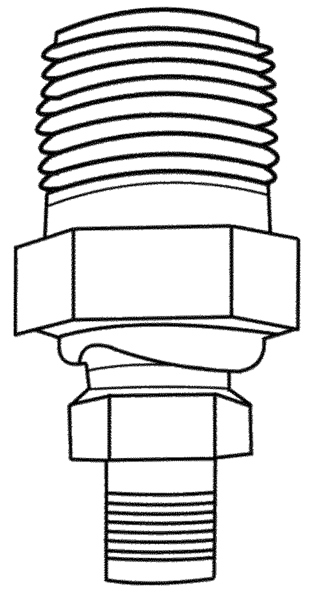
FIG. 1 shows an image of a gas inlet, center of pressure vessel, bottom flange, that can be used with embodiments of the subject invention.
Figure 2:
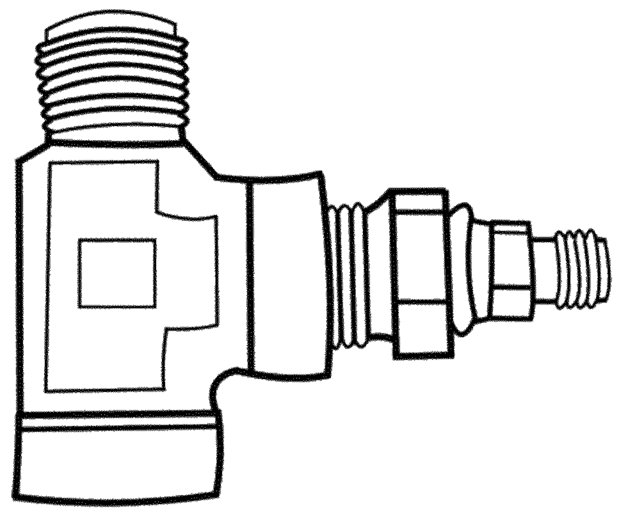
FIG. 2 shows an image of the gas inlet from FIG. 1 after the gas port has been replaced by a “T” fitting (with gas inlet on the side), that can be used with embodiments of the subject invention.
Figure 3:
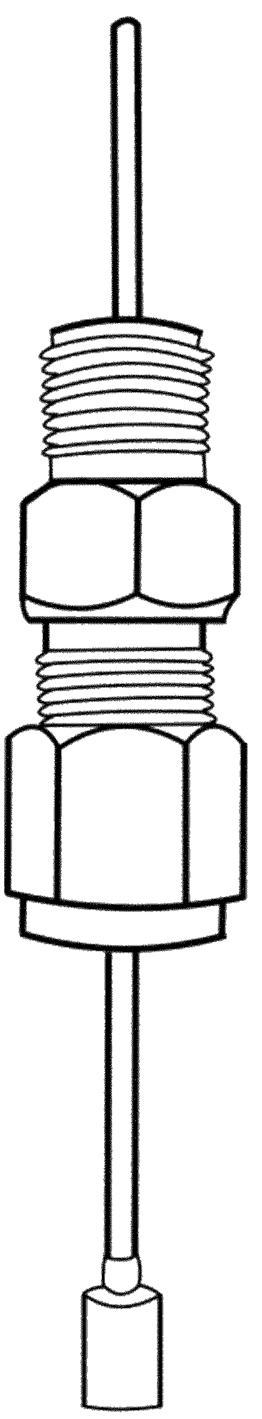
FIG. 3 shows an image of a high pressure gland for thermocouples, that can be used with embodiments of the subject invention. The high pressure gland shown is a Conax™ high pressure gland configured for use with a 0.125-inch thermocouple.
Figure 4:
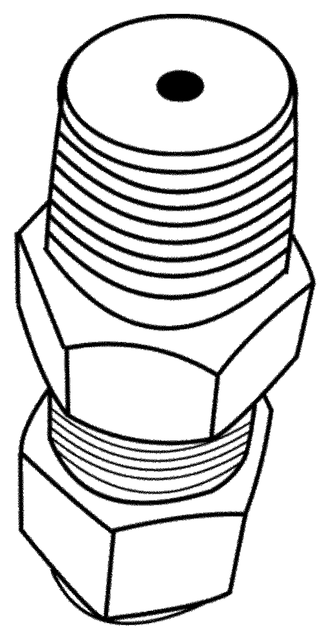
FIG. 4 shows an image of the high pressure gland from FIG. 3.
Figure 5:
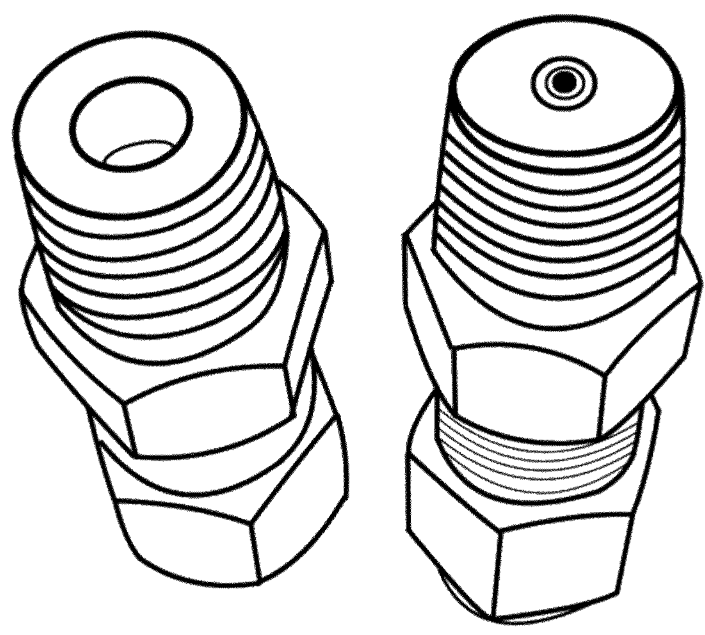
FIG. 5 shows an image of the high pressure gland from FIGS. 3 and 4 after it has been counter-bored to seat a custom-made rotary shaft seal, according to an embodiment of the subject invention.
Figure 6:
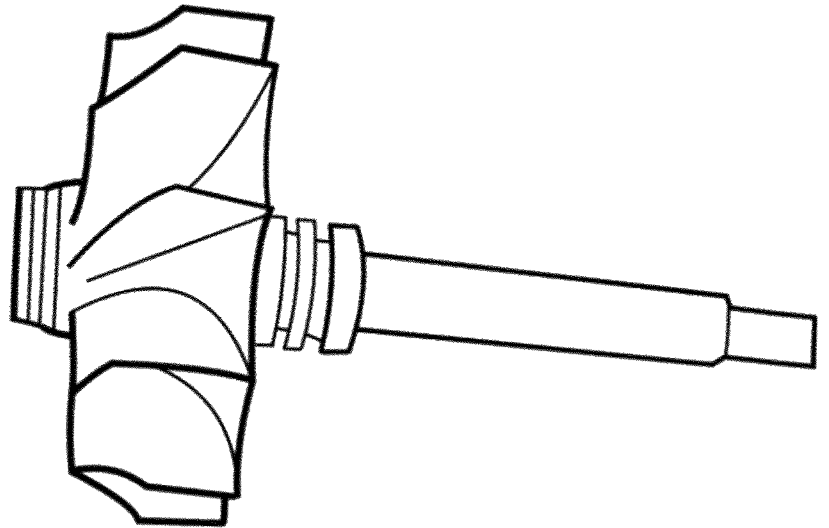
FIG. 6 shows an image of a turbo (or turbine wheel) configured to connect to the end of a shaft, that can be used with embodiments of the subject invention.
Figure 7:
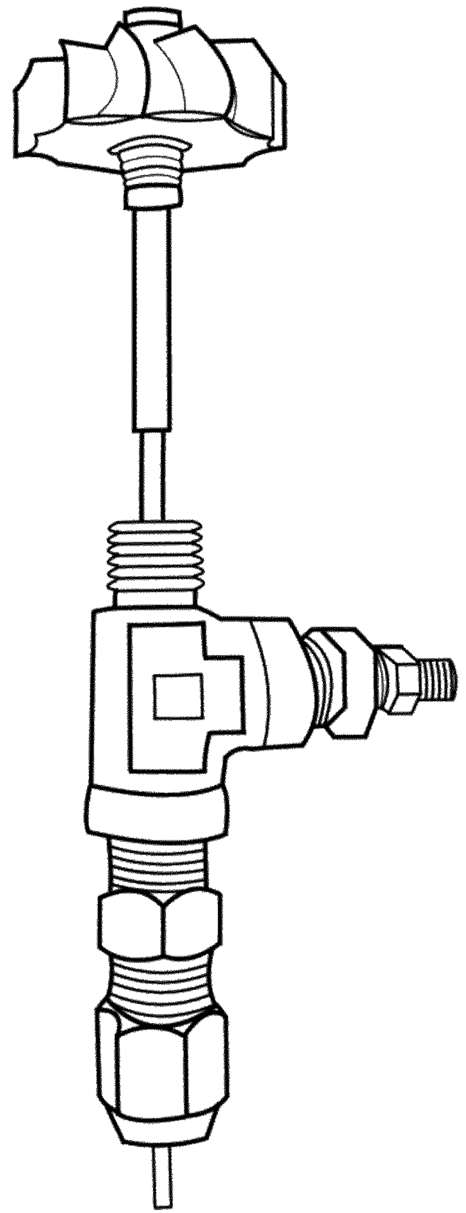
FIG. 7 shows an image of a system for continuously cooling a rotary shaft seal of a pressure vessel, according to an embodiment of the subject invention. The system can include the gas inlet and “T” fitting from FIG. 2, the high pressure gland after counter-boring from FIG. 5, and the turbo from FIG. 6.

FIG. 1 shows a gas inlet for use at a center of a pressure vessel and/or a bottom flange of the pressure vessel, and FIG. 2 shows the gas inlet after the gas port has been replaced by a "T" fitting (with gas inlet on the side). FIGS. 3 and 4 show a high pressure gland for thermocouples, and FIG. 5 shows the high pressure gland after it has been counter-bored to seat a custom-made rotary shaft seal. FIG. 6 shows a turbo (or turbine wheel) configured to connect to the end of a shaft (e.g., the rotary shaft having the rotary shaft seal). FIG. 7 shows an image of a system or device for continuously cooling a rotary shaft seal of a pressure vessel, according to an embodiment of the subject invention. The system can include the gas inlet and "T" fitting from FIG. 2, the high pressure gland (either from FIGS. 3 and 4 or after counter-boring (from FIG. 5)), and the turbine wheel from FIG. 6. In some embodiments, any or all components can be off the shelf, though the rotary shaft seal can be made to predetermined specifications. If the rotary shaft seal fails, the nut on the high pressure gland can be tightened, effectively sealing the shaft and not sacrificing the OPHT run.

Embodiments of the subject invention can be used with a pressure vessel of a furnace. In view of the challenges discussed in the Background, it is important for a furnace to mitigate or eliminate undesirable leak paths associated with conventional furnace designs. A furnace system may address this, and embodiments of the subject invention can further help address the challenges discussed in the Background by continuously cooling the rotary shaft seal of the pressure vessel of the furnace. A furnace system will now be described in further detail. Such furnaces and furnace systems (and methods of using the same) can be used for heat treating materials, such as Bi-2212 or other superconductor materials.

The furnace system can comprise: an outer shell, which comprises a top flange, an elongated body portion, and a bottom flange; a heater assembly that comprises (i) a single piece (i.e., monolithically formed) annular shaped insulation layer, and (ii) a plurality of heaters embedded in the insulation layer, wherein the heater assembly is disposed within the elongated body portion of the outer shell; and an innermost layer disposed within the annular-shaped insulation layer, wherein the innermost layer defines a space in which materials/objects can be disposed for various heat treatments or reactions at high temperatures and pressures.

The furnace of the system can advantageously include an insulation structure with fewer and/or smaller gaps compared to conventional designs, thereby advantageously facilitating better management of the desired temperature and pressure conditions with the furnace, including the ability to reach higher temperatures and pressures than older, less efficient conventional furnaces. It is noted that embodiments of the subject invention can be extended to other applications that utilize high-pressure, high-temperature systems.

The furnace systems and methods of use can be particularly useful in the production of certain types of magnets, superconductors, or superconducting materials. In some particular embodiments, the present furnace system enables the production of Bi-2212 round wire, other Bi-2212 superconductor, general science magnets, nuclear magnetic resonance magnets, high field magnetic resonance imaging magnets, accelerator type magnets, or superconducting high field magnets. Though, the furnace system (an embodiments of the subject invention) can also be applied in other contexts and other types of devices as well, especially those that require high-temperature systems, high-pressure systems, or systems with controlled gas flow.

The furnace can be operated in such a manner as to keep the temperature, pressure, and gas flow rate within suitable temperature and pressure conditions to make certain specialty material products. The temperature and pressure can be controlled by independently controlled heaters and carefully controlled flow of gas.

The furnace can be a vertical well type with a cold wall design and can be electrically powered. The furnace can include an outer shell and a heating assembly inside the outer shell, where the heating assembly further comprises an insulation layer and a plurality of heaters. Inside the heating assembly is an innermost layer. The furnace can further comprise a series of inlets and bores for the electrical feedthroughs, control thermocouples, pressure transducers, and gas inlets or outlets. The furnace can be capable of operating temperatures of at least 890° C. and pressures of at least 735 pounds per square inch (psi). The furnace can generally include various "zones" within the furnace that correspond to each heater.

The outer shell can be a pressure vessel (e.g., a stainless steel pressure vessel) with a top flange, a bottom flange, and a body. The outer shell can also be various other suitable materials, such as an alloy of nickel, chromium, and iron (e.g., an Inconel™). The outer shell can be built to ASME Boiler and Pressure Vessel Code Rules (Section VIII, Division 1). The top flange and bottom flange can be secured to the body by a number of securing means, such as bolts, in the flanges and the body. The body of the outer shell can optionally have no bores, feedthroughs, or inlets.

The top flange can be removable by a hydraulic ram and can comprise a number of inlets or bores for feedthroughs, thermocouples, pressure transducers, and/or gas inlets or outlets. The top flange can specifically comprise the sample thermocouples and gas outlet.

The bottom flange can remain bolted to the body during the loading and operation of the furnace and can comprise a number of inlets or bores for feedthroughs, thermocouples, pressure transducers, and/or gas inlets or outlets. The bottom flange can specifically comprise more inlets or bores than the top flange, comprising the electrical feedthroughs, control thermocouples, pressure transducers, and/or gas inlets.

The heater assembly can further comprise individually controlled heaters (e.g. six individually controlled heaters). The insulation layer can comprise a ceramic fiber shell with a one-piece body and heaters embedded into the shell. The ceramic shell can further comprise a separate bottom plate or can be all one piece. The heater assembly can be cast in one piece to prevent or inhibit gaps in the insulation and ensure the heater elements are flush with the inner diameter. The body of the heater assembly can optionally have no bores, feedthroughs, or inlets. The ceramic shell can comprise electrical lead wires extending from the bottom spaced apart from each other (e.g., spaced 30 degrees apart from each other) around the bottom edge. These wires can be used to guide and secure the ceramic shell into proper alignment with the bottom flange or outer shell. The ceramic housing can also be operated as wall insulation. The ceramic layer can have no penetrations in the body tube. The ceramic layer can be cast in one piece to prevent or inhibit gaps in the insulation.

The furnace can include further insulation (e.g., via insulation plates (e.g., 2-inch thick insulation plates or about 2-inch thick insulation plates) made of, for example, ceramic fiberboard). For example, two such plates can be added to the ceiling of the heater assembly and one such plate can be added to the bottom. The two plates at the top can be secured by any suitable fastener(s).

The heaters can be circular heaters, and each heater can correspond to a certain zone. The heaters can be the same strength, or certain heaters can have more power than others.

The innermost layer can comprise a baffle tube with a series of openings radially spaced around the circumference near the bottom to force a natural convective flow. The innermost layer can be a tube formed of, for example, an alloy of nickel, chromium, and iron (e.g., an Inconel™).

An annular space can be created between the heater assembly and innermost layer. This annular space can allow for control thermocouples to be inserted from the bottom of the assembly, extending into the various zones. Gas entering a bottom inlet can also flow through this annular space. The heaters in the heater assembly, embedded into the ceramic layer, can face this annular space and heat the gas passing through it.

The gas that the furnace operates with can be, for example, a mix of gases, such as a mix of argon and oxygen (e.g., 98% argon and 2% oxygen). The system can include an argon gas feed and a separate argon/oxygen gas feed. In this way, the argon is usually supplied by itself (for example during temperature ramp up) before adding the argon/oxygen to initiate the desired reaction. For example, pure argon can be used to flush the furnace (e.g., for 20-30 minutes or about 20 minutes to about 30 minutes) before switching to a 2% oxygen/98% argon mixture. Other suitable ratios for the desired reaction or other gas mixtures can be used.

An H-bracket can be mounted to the top flange in a manner to secure the insulation plates to the ceiling of the furnace. The H-bracket can serve as a universal mount for various types of magnets, such as solenoids, CCT magnets, and "Race Track" coils. Adjustable holders and hanging fixtures can be removably attachable to the H-bracket to hold materials/objects within the furnace during operation of the furnace. The hanging fixture in the assembled position can hold such objects/materials at a position within the furnace that is optimal for the intended heat treatment, or other reaction, process.

The top flange of the furnace can be removable to provide access to the inside of the furnace. The top flange can be vertically off of the securing mechanisms, such as bolts, to provide this access. Due to the weight of the top flange, a hydraulic ram, counterweight, or other means can be used to lift the flange.

The furnace system can include hardware and/or software that controls gas mixture and flow rates, temperature ramp rate (up and/or down), maximum temperature and duration, and/or dwell times at various temperature (e.g., 10 various temperatures). The hardware can be configured to precisely control the temperature to within 1.5° C., pressure to within 1.5 psi, and gas flow to be exactly 2% oxygen (or 2% oxygen +/−0.1% or 0.01%). The hardware can use a, for example, Lab View based control system and an operating software that renders it superior to IDEC type controllers. The Lab View control system can provide smaller fluctuations in operating temperatures and pressures, as well as more uniform control of ramp rates of change in temperature, compared to conventional control systems with conventional furnaces. These features allow for a homogenous working zone of one meter or more and ensure reliability and repeatability.

The hardware inside of the furnace, such as the H-bracket, as well as surfaces of bores, inlets, and outlets can be, for example, plasma-coated to prevent or inhibit oxidation from occurring during a furnace run. The control thermocouples can be, for example, 0.125 inches in diameter. The furnace system can be configured to be operated to produce superconductors, superconducting materials, or magnets. The materials used to create the product can be inserted into the furnace and set within the working zone. The materials can be in the form of, for example, untreated magnets, superconductors, superconducting materials, alloys, and/or other materials.

The top flange can be re-secured to the top of the vessel to create a sealed container. Once the top flange is secured, the furnace is ready to be pressurized.

The individually controlled heaters can be heated to, for example, 890° C., about 890° C., or at least 890° C. The heaters can be more powerful on the bottom in order to create the working zone. The ramp-up time, cool-down time, and holding time of the heaters can all be controlled. Thermocouples can be used to ensure each heater is heating up, cooling down, and holding at the proper temperatures and rates.

Gas can be inserted through a gas inlet in the bottom flange into the annular space between the insulation layer and innermost layer. The gas rate can be precisely controlled both in total flow rate and in concentration of the gases. The gas flow can be controlled at a desired rate to change the length of the working zone within the furnace. The gas can flow through the annular space, past the heaters, and into the rest of the furnace. The openings at the bottom of the inner layer can provide a natural convective flow of gas through the furnace. The materials can then be exposed to the specific pressure and specific temperature for a period of time required for producing a particular product.

When ranges are used herein, combinations and subcombinations of ranges (including any value or subrange contained therein) are intended to be explicitly included. When the term "about" is used herein, in conjunction with a numerical value, it is understood that the value can be in a range of 95% of the value to 105% of the value, i.e. the value can be +/−5% of the stated value. For example, "about 1 kg" means from 0.95 kg to 1.05 kg.

A greater understanding of the embodiments of the subject invention and of their many advantages may be had from the following examples, given by way of illustration. The following examples are illustrative of some of the methods, applications, embodiments, and variants of the present invention. They are, of course, not to be considered as limiting the invention. Numerous changes and modifications can be made with respect to embodiments of the invention.

Example 1

A system for continuously cooling a rotary shaft seal of a pressure vessel was fabricated. A "T" fitting was added to the gas inlet shown in FIG. 1, replacing the gas port to give the modified gas inlet shown in FIG. 2 (gas inlet is on the side). A Conax™ high pressure gland (shown in FIGS. 3 and 4) configured for thermocouples having a diameter of 0.125 inches was counter-bored to seat a custom-made rotary shaft seal. The resulting modified high pressure gland is shown in FIG. 5. A turbine wheel was added to the end of the rotary shaft of the pressure vessel, as shown in FIG. 6. The modified gas inlet and modified high pressure gland were added the rotary shaft to give the system for continuously cooling a rotary shaft seal of a pressure vessel, as shown in FIG. 7. All components were off the shelf, except the shaft seal, which was made to specifications. If the rotary shaft seal fails, the nut on the Conax™ can be tightened, effectively sealing the shaft and not sacrificing the OPHT run.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:

1. A system for continuously cooling a rotary shaft seal of a pressure vessel, the system comprising:

a rotary shaft;

a turbine wheel attached to a first end of the rotary shaft;

a T fitting having the rotary shaft disposed therethrough;

a gas inlet connected to the T fitting; and a high pressure gland, the rotary shaft being disposed through the high pressure gland, wherein the high pressure gland is disposed closer to a second end of the rotary shaft than is the T fitting, wherein the second end of the rotary shaft is opposite from the first end of the rotary shaft, wherein the T fitting is disposed between the turbine wheel and the high pressure gland, and wherein the high pressure gland comprises a nut that is configured to be tightened.

2. The system according to claim 1, wherein the pressure vessel is a pressure vessel of a furnace.

3. The system according to claim 1, wherein the high pressure gland is counter-bored.

4. The system according to claim 1, wherein the high pressure gland is a Conax high pressure gland.

5. The system according to claim 1, further comprising the rotary shaft seal attached to the rotary shaft.

6. The system according to claim 1, wherein the T-fitting is connected to a gas port of the gas inlet.

7. The system according to claim 1, further comprising a baffle tube integrated with the rotary shaft.

8. The system according to claim 7, wherein the baffle tube has a diameter that decreases from a top of the baffle tube to a bottom of the baffle tube.

* * * * *